US010273147B2

(12) United States Patent
Boysel

(10) Patent No.: US 10,273,147 B2
(45) Date of Patent: Apr. 30, 2019

(54) MEMS COMPONENTS AND METHOD OF WAFER-LEVEL MANUFACTURING THEREOF

(71) Applicant: Motion Engine Inc., Montreal (CA)

(72) Inventor: Robert Mark Boysel, Honeoye Falls, NY (US)

(73) Assignee: Motion Engine Inc., Montreal (CA)

( * ) Notice: Subject to any disclaimer, the term of this patent is extended or adjusted under 35 U.S.C. 154(b) by 0 days.

(21) Appl. No.: 15/024,711

(22) PCT Filed: Sep. 19, 2014

(86) PCT No.: PCT/CA2014/050902
§ 371 (c)(1),
(2) Date: Mar. 24, 2016

(87) PCT Pub. No.: WO2015/042700
PCT Pub. Date: Apr. 2, 2015

(65) Prior Publication Data
US 2016/0229685 A1 Aug. 11, 2016
US 2018/0362330 A9 Dec. 20, 2018

Related U.S. Application Data

(63) Continuation-in-part of application No. 14/622,619, filed on Feb. 23, 2015, now Pat. No. 9,309,106, which
(Continued)

(51) Int. Cl.
*G01P 15/08* (2006.01)
*B81B 7/00* (2006.01)
*B81C 1/00* (2006.01)

(52) U.S. Cl.
CPC .......... *B81B 7/007* (2013.01); *B81C 1/00238* (2013.01); *B81B 2201/0235* (2013.01);
(Continued)

(58) Field of Classification Search
CPC .... B81B 2201/0235; B81B 2201/0242; B81B 2201/0264; B81B 2207/012;
(Continued)

(56) References Cited

U.S. PATENT DOCUMENTS 4,430,895 A 2/1984 Colton
4,483,194 A 11/1984 Rudolf
(Continued)

FOREIGN PATENT DOCUMENTS

EP 1802952 A1 7/2007
EP 2410344 A2 1/2012
(Continued)

OTHER PUBLICATIONS

European Search Report for Application No. 14822259.9 dated Jan. 4, 2017.
(Continued)

*Primary Examiner* — Meiya Li
(74) *Attorney, Agent, or Firm* — McCarter & English, LLP; Thomas O. Hoover

(57) ABSTRACT

A MEMS and a method of manufacturing MEMS components are provided. The method includes providing a MEMS wafer stack including a top cap wafer, a MEMS wafer and optionally a bottom cap wafer. The MEMS wafer has MEMS structures patterned therein. The MEMS wafer and the cap wafers include insulated conducting channels forming insulated conducting pathways extending within the wafer stack. The wafer stack is bonded to an integrated circuit wafer having electrical contacts on its top side, such that the insulated conducting pathways extend from the integrated circuit wafer to the outer side of the top cap wafer. Electrical contacts on the outer side of the top cap wafer are formed and are electrically connected to the respective insulated conducting channels of the top cap wafer. The
(Continued)

MEMS wafer stack and the integrated circuit wafer are then diced into components having respective sealed chambers and MEMS structures housed therein.

8 Claims, 10 Drawing Sheets

Related U.S. Application Data is a continuation-in-part of application No. PCT/CA2014/050635, filed on Jul. 4, 2014.

(60) Provisional application No. 61/881,592, filed on Sep. 24, 2013, provisional application No. 61/843,598, filed on Jul. 8, 2013.

(52) U.S. Cl.
CPC .......... *B81B 2201/0242* (2013.01); *B81B 2201/0264* (2013.01); *B81B 2207/012* (2013.01); *B81B 2207/015* (2013.01); *B81B 2207/07* (2013.01); *B81B 2207/095* (2013.01); *B81C 2201/013* (2013.01); *B81C 2203/0792* (2013.01)

(58) Field of Classification Search
CPC .......... B81B 2207/015; B81B 2207/07; B81B 2207/095; B81B 7/007; B81C 1/00238; B81C 2201/013; B81C 2203/0792; H01L 2924/1461; H01L 41/00; H01L 41/0825; H01L 41/053; H01L 41/0973; H01L 41/113; H01L 41/23; H01L 41/311
See application file for complete search history.

(56) References Cited

U.S. PATENT DOCUMENTS

| | | |
|---|---|---|
| 4,553,436 A | 11/1985 | Hansson |
| 4,805,456 A | 2/1989 | Howe et al. |
| 4,833,417 A | 5/1989 | Schroeder |
| 4,881,408 A | 11/1989 | Hulsing, II et al. |
| 4,882,933 A | 11/1989 | Petersen et al. |
| 4,905,523 A | 3/1990 | Okada |
| 4,967,605 A | 11/1990 | Okada |
| 5,235,457 A | 8/1993 | Lichtman et al. |
| 5,239,984 A | 8/1993 | Cane et al. |
| 5,359,893 A | 11/1994 | Dunn |
| 5,557,046 A | 9/1996 | Hulsing, II |
| 5,596,144 A | 1/1997 | Swanson |
| 5,608,210 A | 3/1997 | Esparza et al. |
| 5,614,742 A | 3/1997 | Gessner et al. |
| 5,646,346 A | 7/1997 | Okada |
| 5,662,111 A | 9/1997 | Cosman |
| 5,777,226 A | 7/1998 | Ip |
| 5,831,163 A | 11/1998 | Okada |
| 5,894,090 A | 4/1999 | Tang et al. |
| 5,895,850 A | 4/1999 | Buestgens |
| 5,898,223 A | 4/1999 | Frye et al. |
| 5,920,011 A | 7/1999 | Hulsing, II |
| 5,959,206 A | 9/1999 | Ryrko et al. |
| 5,962,784 A | 10/1999 | Hulsing, II |
| 5,977,640 A | 11/1999 | Bertin et al. |
| 5,987,985 A | 11/1999 | Okada |
| 6,003,371 A | 12/1999 | Okada |
| 6,028,773 A | 2/2000 | Hundt |
| 6,053,057 A | 4/2000 | Okada |
| 6,058,778 A | 5/2000 | Chan et al. |
| 6,079,272 A | 6/2000 | Stell et al. |
| 6,090,638 A | 7/2000 | Vigna et al. |
| 6,091,132 A | 7/2000 | Bryant |
| 6,119,517 A | 9/2000 | Breng et al. |
| 6,122,961 A | 9/2000 | Geen et al. |
| 6,159,773 A | 12/2000 | Lin |
| 6,184,052 B1 | 2/2001 | Vigna et al. |
| 6,225,699 B1 | 5/2001 | Ference et al. |
| 6,235,550 B1 | 5/2001 | Chan et al. |
| 6,257,057 B1 | 7/2001 | Hulsing, II |
| 6,282,956 B1 | 9/2001 | Okada |
| 6,295,870 B1 | 10/2001 | Hulsing, II |
| 6,391,673 B1 | 5/2002 | Ha et al. |
| 6,399,997 B1 | 6/2002 | Lin et al. |
| 6,469,330 B1 | 10/2002 | Vigna et al. |
| 6,487,000 B2 | 11/2002 | Mastromatteo et al. |
| 6,490,923 B1 | 12/2002 | Breng et al. |
| 6,508,124 B1 | 1/2003 | Zerbini et al. |
| 6,539,801 B1 | 4/2003 | Gutierrez et al. |
| 6,584,845 B1 | 7/2003 | Gutierrez et al. |
| 6,587,312 B2 | 7/2003 | Murari et al. |
| 6,621,137 B1 | 9/2003 | Ma et al. |
| 6,651,500 B2 | 11/2003 | Stewart et al. |
| 6,675,630 B2 | 1/2004 | Challoner et al. |
| 6,696,364 B2 | 2/2004 | Gelmi et al. |
| 6,701,786 B2 | 3/2004 | Hulsing, II |
| 6,705,167 B2 | 3/2004 | Kvisteroey et al. |
| 6,715,353 B2 | 4/2004 | Johnson |
| 6,766,689 B2 | 7/2004 | Spinola Durante et al. |
| 6,772,632 B2 | 8/2004 | Okada |
| 6,808,952 B1 | 10/2004 | Sniegowski et al. |
| 6,808,955 B2 | 10/2004 | Ma |
| 6,829,937 B2 | 12/2004 | Mahon |
| 6,841,861 B2 | 1/2005 | Brady |
| 6,856,144 B2 | 2/2005 | Lasalandra et al. |
| 6,863,832 B1 | 3/2005 | Wiemer et al. |
| 6,865,943 B2 | 3/2005 | Okada |
| 6,892,575 B2 | 5/2005 | Nasiri et al. |
| 6,925,875 B2 | 8/2005 | Silverbrook |
| 6,939,473 B2 | 9/2005 | Nasiri et al. |
| 6,942,750 B2 | 9/2005 | Chou et al. |
| 6,944,931 B2 | 9/2005 | Shcheglov et al. |
| 6,953,985 B2 | 10/2005 | Lin et al. |
| 6,990,863 B2 | 1/2006 | Challoner et al. |
| 6,991,957 B2 | 1/2006 | Eskridge |
| 6,993,617 B2 | 1/2006 | Butcher et al. |
| 7,017,410 B2 | 3/2006 | Challoner et al. |
| 7,040,163 B2 | 5/2006 | Shcheglov et al. |
| 7,043,985 B2 | 5/2006 | Ayazi et al. |
| 7,056,757 B2 | 6/2006 | Ayazi et al. |
| 7,093,486 B2 | 8/2006 | Challoner et al. |
| 7,100,448 B2 | 9/2006 | Ikegami |
| 7,104,129 B2 | 9/2006 | Nasiri et al. |
| 7,138,694 B2 | 11/2006 | Nunan et al. |
| 7,159,441 B2 | 1/2007 | Challoner et al. |
| 7,168,317 B2 | 1/2007 | Chen et al. |
| 7,168,318 B2 | 1/2007 | Challoner et al. |
| 7,176,556 B2 | 2/2007 | Okamoto et al. |
| 7,180,019 B1 | 2/2007 | Chiou et al. |
| 7,210,351 B2 | 5/2007 | Lo et al. |
| 7,217,588 B2 | 5/2007 | Hartzell et al. |
| 7,238,999 B2 | 7/2007 | LaFond et al. |
| 7,247,246 B2 | 7/2007 | Nasiri et al. |
| 7,250,112 B2 | 7/2007 | Nasiri et al. |
| 7,250,353 B2 | 7/2007 | Nasiri et al. |
| 7,258,008 B2 | 8/2007 | Durante et al. |
| 7,258,011 B2 | 8/2007 | Nasiri et al. |
| 7,258,012 B2 | 8/2007 | Xie |
| 7,275,424 B2 | 10/2007 | Felton et al. |
| 7,291,561 B2 | 11/2007 | Ma et al. |
| 7,318,349 B2 | 1/2008 | Vaganov et al. |
| 7,322,236 B2 | 1/2008 | Combi et al. |
| 7,337,671 B2 | 3/2008 | Ayazi et al. |
| 7,347,095 B2 | 3/2008 | Shcheglov et al. |
| 7,360,423 B2 | 4/2008 | Ayazi et al. |
| 7,402,905 B2 | 7/2008 | Eskridge et al. |
| 7,417,329 B2 | 8/2008 | Chuang et al. |
| 7,442,570 B2 | 10/2008 | Nasiri et al. |
| 7,458,263 B2 | 12/2008 | Nasiri et al. |
| 7,484,410 B2 | 2/2009 | Tsuji et al. |
| 7,491,567 B2 | 2/2009 | DCamp et al. |
| 7,518,493 B2 | 4/2009 | Bryzek et al. |
| 7,543,496 B2 | 6/2009 | Ayazi et al. |
| 7,578,189 B1 | 8/2009 | Mehregany |
| 7,615,406 B2 | 11/2009 | Higashi et al. |

(56) References Cited

U.S. PATENT DOCUMENTS

| | | |
|---|---|---|
| 7,621,183 B2 | 11/2009 | Seeger et al. |
| 7,624,494 B2 | 12/2009 | Challoner et al. |
| 7,642,115 B2 | 1/2010 | Eriksen et al. |
| 7,642,657 B2 | 1/2010 | Suilleabhain et al. |
| 7,677,099 B2 | 3/2010 | Nasiri et al. |
| 7,684,101 B2 | 3/2010 | Border et al. |
| 7,694,563 B2 | 4/2010 | Durante et al. |
| 7,748,272 B2 | 7/2010 | Kranz et al. |
| 7,755,367 B2 | 7/2010 | Schoen et al. |
| 7,767,483 B1 | 8/2010 | Waters |
| 7,784,344 B2 | 8/2010 | Pavelescu et al. |
| 7,786,572 B2 | 8/2010 | Chen |
| 7,851,898 B2 | 12/2010 | Nakamura et al. |
| 7,863,698 B2 | 1/2011 | Seeger et al. |
| 7,875,942 B2 | 1/2011 | Cortese et al. |
| 7,882,740 B2 | 2/2011 | Okada |
| 7,886,601 B2 | 2/2011 | Merassi et al. |
| 7,898,043 B2 | 3/2011 | Ziglioli et al. |
| 7,908,921 B2 | 3/2011 | Binda et al. |
| 7,928,632 B2 | 4/2011 | Yang et al. |
| 7,934,423 B2 | 5/2011 | Nasiri et al. |
| 7,964,428 B2 | 6/2011 | Breng et al. |
| 7,982,291 B2 | 7/2011 | Kuisma |
| 7,982,558 B2 | 7/2011 | Sworowski et al. |
| 8,042,394 B2 | 10/2011 | Coronato et al. |
| 8,047,075 B2 | 11/2011 | Nasiri et al. |
| 8,049,515 B2 | 11/2011 | Schoen et al. |
| 8,069,726 B2 | 12/2011 | Seeger et al. |
| 8,071,398 B1 | 12/2011 | Yang et al. |
| 8,077,372 B2 | 12/2011 | Border et al. |
| 8,080,869 B2 | 12/2011 | Okuda et al. |
| 8,084,332 B2 | 12/2011 | Nasiri et al. |
| 8,100,012 B2 | 1/2012 | Martin et al. |
| 8,124,895 B2 | 2/2012 | Merassi et al. |
| 8,134,214 B2 | 3/2012 | Baldo et al. |
| 8,151,640 B1 | 4/2012 | Kubena |
| 8,176,782 B2 | 5/2012 | Furukubo et al. |
| 8,227,285 B1 | 7/2012 | Yang et al. |
| 8,227,911 B1 | 7/2012 | Yang et al. |
| 8,236,577 B1 | 8/2012 | Hsu et al. |
| 8,258,590 B2 | 9/2012 | Geiger et al. |
| 8,272,266 B2 | 9/2012 | Zhang et al. |
| 8,283,737 B2 | 10/2012 | Sugizaki |
| 8,289,092 B2 | 10/2012 | Pomarico et al. |
| 8,314,483 B2 | 11/2012 | Lin et al. |
| 8,324,047 B1 | 12/2012 | Yang |
| 8,347,717 B2 | 1/2013 | Seeger et al. |
| 8,350,346 B1 | 1/2013 | Huang et al. |
| 8,365,595 B2 | 2/2013 | Geiger et al. |
| 8,372,677 B2 | 2/2013 | Mehregany |
| 8,375,789 B2 | 2/2013 | Prandi et al. |
| 8,384,134 B2 | 2/2013 | Daneman et al. |
| 8,390,173 B2 | 3/2013 | Yoshihara et al. |
| 8,395,252 B1 | 3/2013 | Yang |
| 8,395,381 B2 | 3/2013 | Lo et al. |
| 8,402,666 B1 | 3/2013 | Hsu et al. |
| 8,405,170 B2 | 3/2013 | Kohl et al. |
| 8,407,905 B1 | 4/2013 | Hsu et al. |
| 8,413,506 B2 | 4/2013 | Coronato et al. |
| 8,421,082 B1 | 4/2013 | Yang |
| 8,426,961 B2 | 4/2013 | Shih et al. |
| 8,432,005 B2 | 4/2013 | Yang et al. |
| 8,433,084 B2 | 4/2013 | Conti et al. |
| 8,459,093 B2 | 6/2013 | Donadel et al. |
| 8,459,110 B2 | 6/2013 | Cazzaniga et al. |
| 8,461,935 B2 | 6/2013 | McCraith et al. |
| 8,481,365 B2 | 7/2013 | Verhelijden et al. |
| 8,487,444 B2 | 7/2013 | Law et al. |
| 8,490,461 B2 | 7/2013 | Sasaki et al. |
| 8,490,483 B2 | 7/2013 | Wrede et al. |
| 8,508,039 B1 | 8/2013 | Nasiri et al. |
| 8,508,045 B2 | 8/2013 | Khan et al. |
| 8,513,747 B1 | 8/2013 | Huang et al. |
| 8,519,537 B2 | 8/2013 | Jeng et al. |
| 8,567,246 B2 | 10/2013 | Shaeffer et al. |
| 8,569,090 B2 | 10/2013 | Taheri |
| 8,587,077 B2 | 11/2013 | Chen |
| 8,593,036 B2 | 11/2013 | Boysel |
| 8,637,943 B1 | 1/2014 | Yang |
| 8,652,961 B1 | 2/2014 | Yang |
| 8,685,776 B2 | 4/2014 | LaFond et al. |
| 8,704,238 B2 | 4/2014 | Yang et al. |
| 8,759,926 B2 | 6/2014 | Fujii et al. |
| 8,869,616 B1 | 10/2014 | Sridharamurthy et al. |
| 8,885,170 B2 | 11/2014 | Kilic et al. |
| 8,921,145 B2 | 12/2014 | Shu et al. |
| 9,046,541 B1 | 6/2015 | Kubena et al. |
| 9,309,106 B2 | 4/2016 | Boysel et al. |
| 9,499,397 B2 | 11/2016 | Bowles et al. |
| 2001/0011994 A1 | 8/2001 | Morimoto et al. |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi et al. |
| 2004/0063239 A1 | 4/2004 | Yun et al. |
| 2004/0224279 A1 | 11/2004 | Siemons |
| 2004/0231422 A1 | 11/2004 | Okada |
| 2005/0210981 A1 | 9/2005 | Okada |
| 2006/0163453 A1 | 7/2006 | Hynes et al. |
| 2006/0179941 A1 | 8/2006 | Okada |
| 2006/0180896 A1 | 8/2006 | Martin et al. |
| 2006/0185428 A1 | 8/2006 | Combi et al. |
| 2007/0273018 A1 | 11/2007 | Onozuka et al. |
| 2007/0279885 A1 | 12/2007 | Basavanhally et al. |
| 2008/0289417 A1 | 11/2008 | Okada |
| 2009/0114016 A1 | 5/2009 | Nasiri et al. |
| 2010/0132460 A1 | 6/2010 | Seeger et al. |
| 2010/0176466 A1 | 7/2010 | Fujii et al. |
| 2010/0182418 A1 | 7/2010 | Jess et al. |
| 2010/0324366 A1 | 12/2010 | Shimotsu |
| 2011/0030473 A1 | 2/2011 | Acar |
| 2011/0219876 A1 | 9/2011 | Kalnitsky et al. |
| 2011/0228906 A1 | 9/2011 | Jaffray et al. |
| 2012/0042731 A1 | 2/2012 | Lin et al. |
| 2012/0048017 A1 | 3/2012 | Kempe |
| 2012/0091854 A1 | 4/2012 | Kaajakari |
| 2012/0137774 A1 | 6/2012 | Judy et al. |
| 2012/0142144 A1 | 6/2012 | Taheri |
| 2012/0227487 A1 | 9/2012 | Ayazi et al. |
| 2012/0300050 A1 | 11/2012 | Korichi et al. |
| 2012/0326248 A1 | 12/2012 | Daneman et al. |
| 2013/0019680 A1 | 1/2013 | Kittilsland et al. |
| 2013/0100271 A1 | 4/2013 | Howes |
| 2013/0105921 A1* | 5/2013 | Najafi ................ G01P 15/0802 257/415 |
| 2013/0115729 A1 | 5/2013 | Silverbrook et al. |
| 2013/0119492 A1 | 5/2013 | Feiertag et al. |
| 2013/0126992 A1 | 5/2013 | Ehrenpfordt et al. |
| 2013/0146994 A1 | 6/2013 | Kittilsland et al. |
| 2013/0147020 A1 | 6/2013 | Gonska et al. |
| 2013/0168740 A1 | 7/2013 | Chen |
| 2013/0181355 A1 | 7/2013 | Tsai et al. |
| 2013/0221454 A1 | 8/2013 | Dunbar, III et al. |
| 2013/0253335 A1 | 9/2013 | Noto et al. |
| 2013/0285165 A1* | 10/2013 | Classen ................ B81C 1/00238 257/415 |
| 2013/0341737 A1 | 12/2013 | Bryzek et al. |
| 2014/0007685 A1 | 1/2014 | Zhang et al. |
| 2014/0090485 A1 | 4/2014 | Feyh et al. |
| 2014/0091405 A1 | 4/2014 | Weber |
| 2014/0092460 A1 | 4/2014 | Schwedt et al. |
| 2014/0116135 A1 | 5/2014 | Cazzaniga et al. |
| 2014/0116136 A1 | 5/2014 | Coronato et al. |
| 2014/0124958 A1 | 5/2014 | Bowles et al. |
| 2014/0137648 A1 | 5/2014 | Zolfagharkhani et al. |
| 2014/0138853 A1 | 5/2014 | Liu et al. |
| 2014/0162393 A1 | 6/2014 | Yang |
| 2014/0166463 A1 | 6/2014 | Jahnes et al. |
| 2014/0183729 A1 | 7/2014 | Bowles |
| 2014/0186986 A1 | 7/2014 | Shu et al. |
| 2014/0193949 A1 | 7/2014 | Wu |
| 2014/0203421 A1 | 7/2014 | Shu et al. |
| 2014/0210019 A1 | 7/2014 | Nasiri et al. |
| 2014/0227816 A1 | 8/2014 | Zhang et al. |

(56) References Cited

U.S. PATENT DOCUMENTS

| | | |
|---|---|---|
| 2014/0230548 A1 | 8/2014 | Coronato et al. |
| 2014/0231936 A1 | 8/2014 | Jahnes et al. |
| 2014/0231938 A1 | 8/2014 | Campedelli et al. |
| 2014/0260617 A1 | 9/2014 | Ocak et al. |
| 2014/0283605 A1 | 9/2014 | Baldasarre et al. |
| 2014/0287548 A1 | 9/2014 | Lin et al. |
| 2014/0291128 A1 | 10/2014 | Kwa |
| 2014/0311242 A1 | 10/2014 | Lee et al. |
| 2014/0311247 A1 | 10/2014 | Zhang et al. |
| 2014/0318906 A1 | 10/2014 | Deimerly et al. |
| 2014/0319630 A1 | 10/2014 | Conti et al. |
| 2014/0322854 A1 | 10/2014 | Nakatani et al. |
| 2014/0326070 A1 | 11/2014 | Neul et al. |
| 2014/0331769 A1 | 11/2014 | Fell |
| 2014/0339654 A1 | 11/2014 | Classen |
| 2014/0339656 A1 | 11/2014 | Schlarmann et al. |
| 2014/0349434 A1 | 11/2014 | Huang et al. |
| 2014/0352433 A1 | 12/2014 | Hammer |
| 2014/0353775 A1 | 12/2014 | Formosa et al. |
| 2014/0357007 A1 | 12/2014 | Cheng et al. |
| 2014/0370638 A1 | 12/2014 | Lee et al. |
| 2014/0374854 A1 | 12/2014 | Xue |
| 2014/0374917 A1 | 12/2014 | Weber et al. |
| 2014/0374918 A1 | 12/2014 | Weber et al. |
| 2015/0008545 A1 | 1/2015 | Quevy et al. |
| 2015/0115376 A1 | 4/2015 | Chen et al. |
| 2015/0191345 A1 | 7/2015 | Boysel et al. |
| 2015/0198493 A1 | 7/2015 | Kaelberer et al. |
| 2015/0260519 A1 | 9/2015 | Boysel et al. |
| 2015/0371390 A1 | 12/2015 | Gassner et al. |
| 2016/0229684 A1 | 8/2016 | Boysel |
| 2016/0320426 A1 | 11/2016 | Boysel et al. |
| 2017/0030788 A1 | 2/2017 | Boysel et al. |
| 2017/0108336 A1 | 4/2017 | Boysel et al. |
| 2017/0363694 A1 | 12/2017 | Boysel |
| 2018/0002163 A1 | 1/2018 | Boysel |
| 2018/0074090 A1 | 3/2018 | Boysel |

FOREIGN PATENT DOCUMENTS

| | | |
|---|---|---|
| EP | 3019442 A1 | 5/2016 |
| JP | 2008-114354 A | 5/2008 |
| JP | 2008-132587 A | 6/2008 |
| JP | 2009-245877 A | 10/2009 |
| JP | 2011-194478 A | 10/2011 |
| JP | 2012-247192 A | 12/2012 |
| JP | 2013-030759 A | 2/2013 |
| JP | 2013-164285 A | 8/2013 |
| WO | 2008086530 A2 | 7/2008 |
| WO | 2009/057990 A2 | 5/2009 |
| WO | 2011/151098 A2 | 12/2011 |
| WO | 2013116356 A1 | 8/2013 |
| WO | 2014122910 A1 | 8/2014 |
| WO | 2014159957 A1 | 10/2014 |
| WO | 2014177542 A1 | 11/2014 |
| WO | 2014184025 A1 | 11/2014 |
| WO | 2015003264 A1 | 1/2015 |
| WO | 2015013827 A1 | 2/2015 |
| WO | 2015013828 A1 | 2/2015 |
| WO | 2015042700 A1 | 4/2015 |
| WO | 2015042701 A1 | 4/2015 |
| WO | 2015042702 A1 | 4/2015 |
| WO | 2015103688 A1 | 7/2015 |
| WO | 2015154173 A1 | 10/2015 |

OTHER PUBLICATIONS

A Single-Proof-Mass MEMS Multi-Axis Motion Sensor by Dr. Mark Boysel, Semicon Japan 2008.

Development of a Single-Mass Five-Axis MEMS Motion Sensor, By Rai Boysel, L.J. Ross, Virtus Advanced Sensors, Inc.., May 2009.

International Search Report and Written Opinion for International Patent Application No. PCT/CA2014/050729, dated Nov. 3, 2014.

International Search Report and Written Opinion for International Patent Application No. PCT/CA2014/050902, dated Dec. 15, 2014.

International Search Report and Written Opinion for International Patent Application No. PCT/CA2014/050904, dated Dec. 1, 2014.

International Search Report and Written Opinion for International Patent Application No. PCT/CA2014/050910, dated Dec. 22, 2014.

International Search Report and Written Opinion for International Patent Application No. PCT/CA2014/051245, dated Feb. 25, 2015.

International Search Report and Written Opinion for International Patent Application No. PCT/CA2015/050018, dated Apr. 20, 2015.

International Search Report and Written Opinion for International Patent Application No. PCT/CA2015/050026, dated Apr. 27, 2015.

SOI micromachined 5-axis motion sensor using resonant electrostatic drive and non-resonant capacitive detection mode by Yoshiyuki Watanabe, Toshiaki Mitsui, Takashi Mineta, Yoshiyuki Matsu, Kazuhiro Okada, Available online Jan. 18, 2006.

Virtus Sensor Technology by Dr. Mark Boysel, Semicon Japan, Nov. 11, 2008.

International Search Report and Written Opinion for Application No. PCT/CA2016/050303, dated Jun. 13, 2016. 7 pages.

International Search Report for Application No. PCT/CA2014/050730, dated Nov. 3, 2014. 3 pages.

International Search Report for Application No. PCT/CA2016/050031, dated Mar. 16, 2016. 3 pages.

Supplementary European Search Report for Application No. 14831791.0, dated Jun. 12, 2017, 8 pages.

* cited by examiner

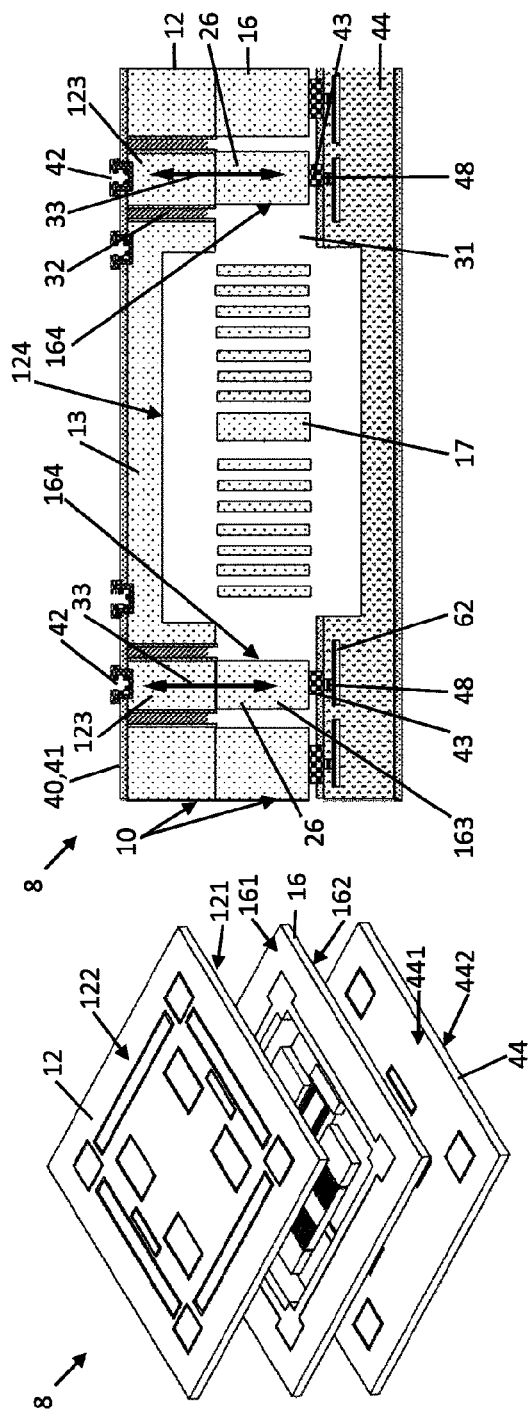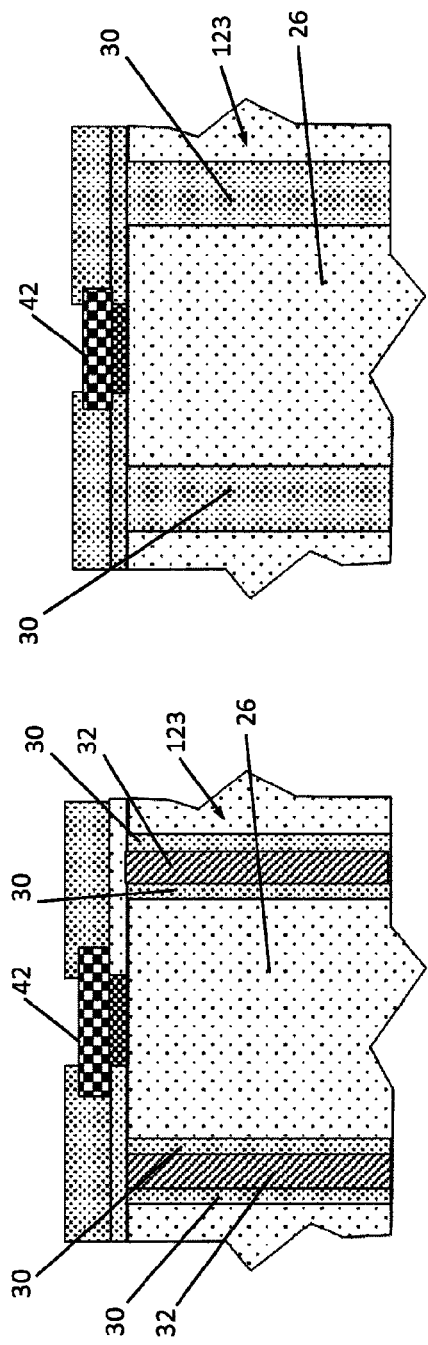
FIG. 1A
FIG. 1B
FIG. 1C
FIG. 1D

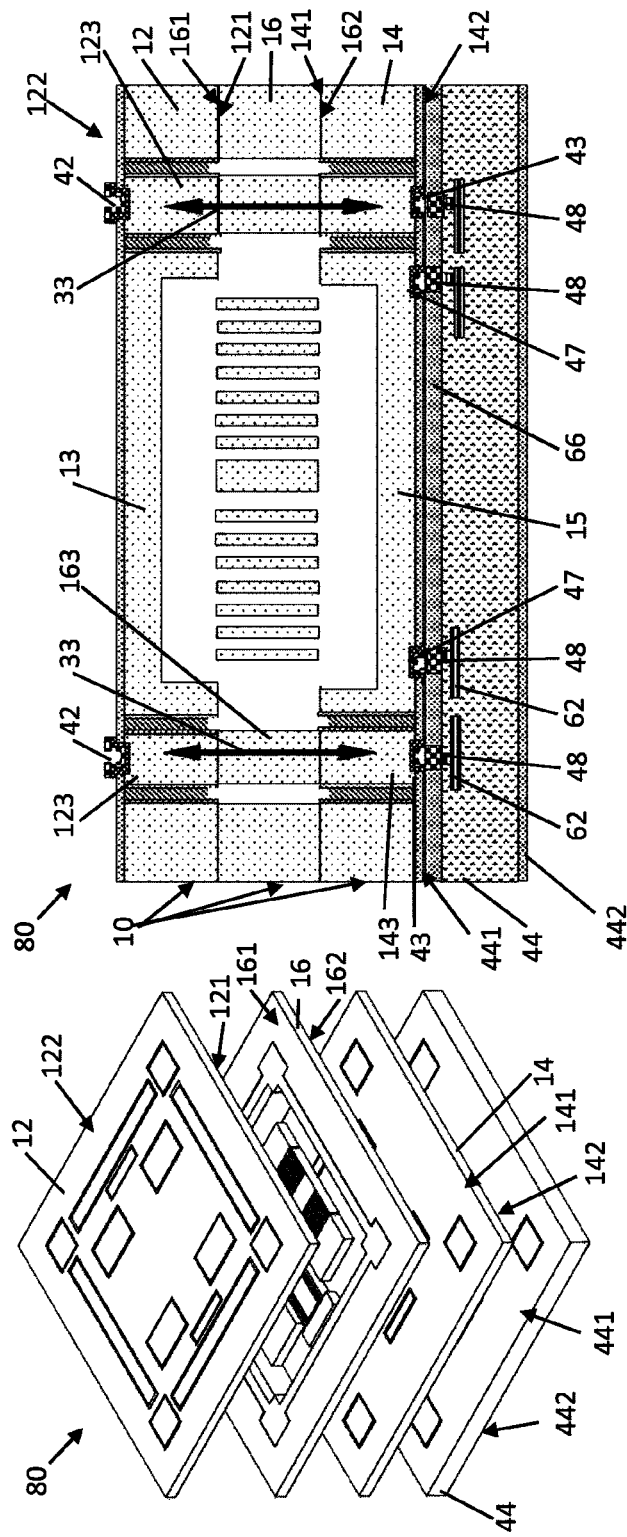

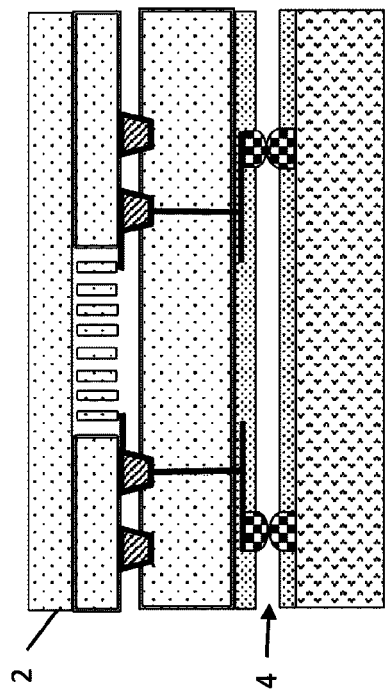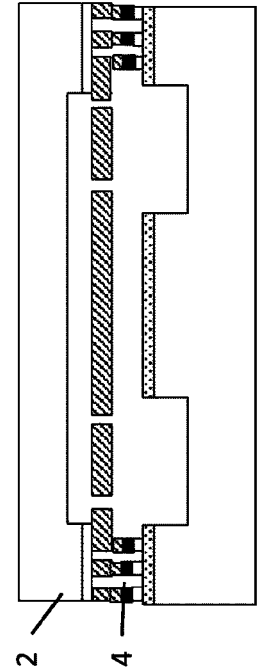
FIG. 3B (PRIOR ART)
FIG. 4B (PRIOR ART)
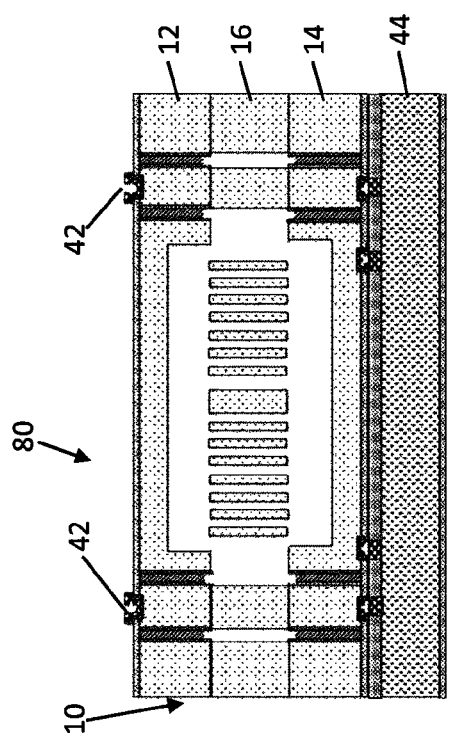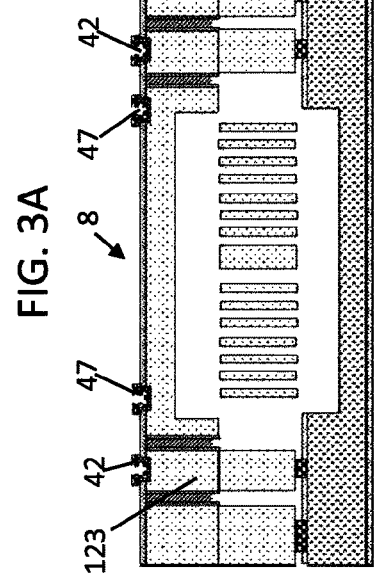
FIG. 3A
FIG. 4A

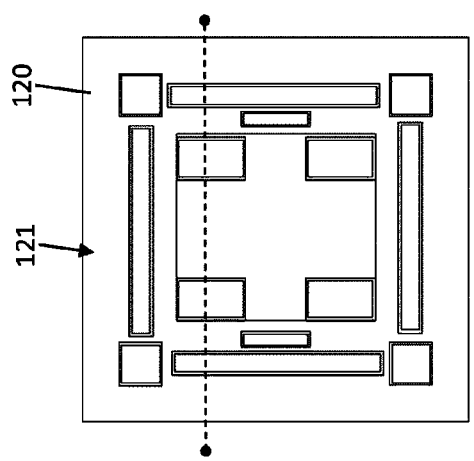
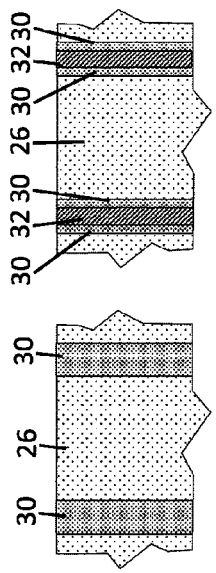
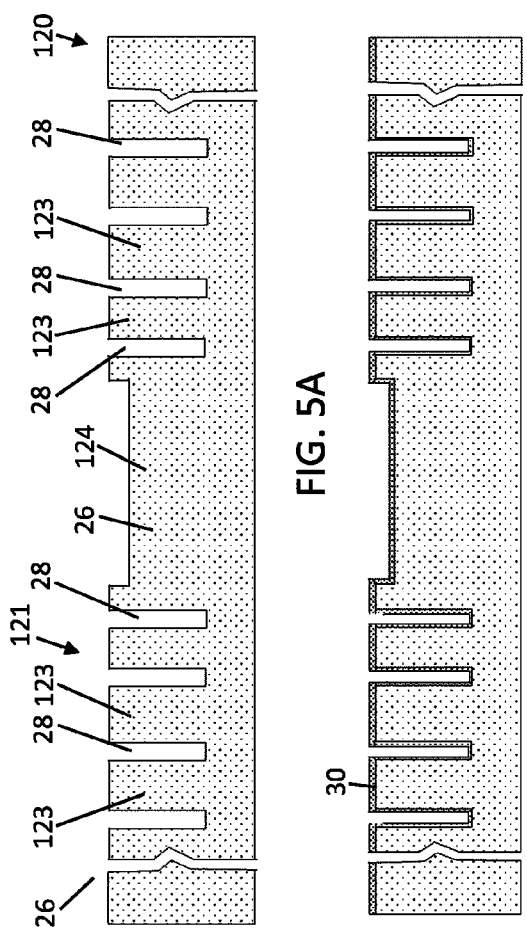
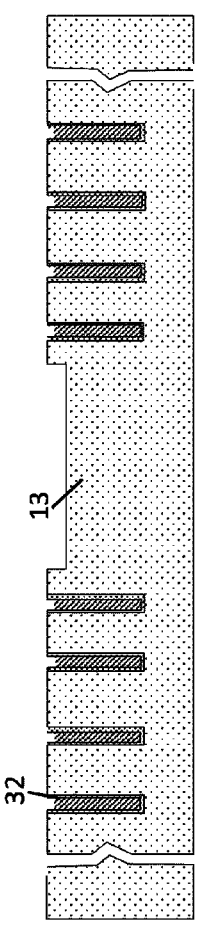
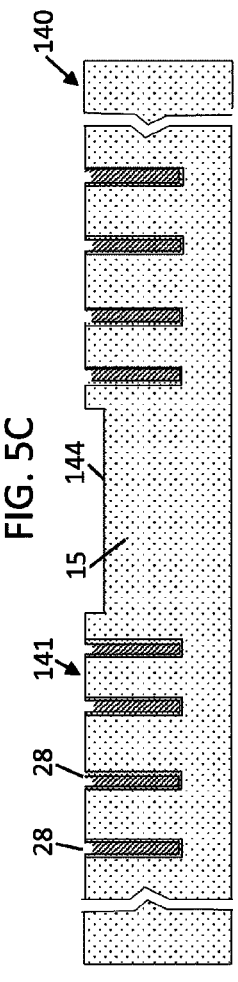

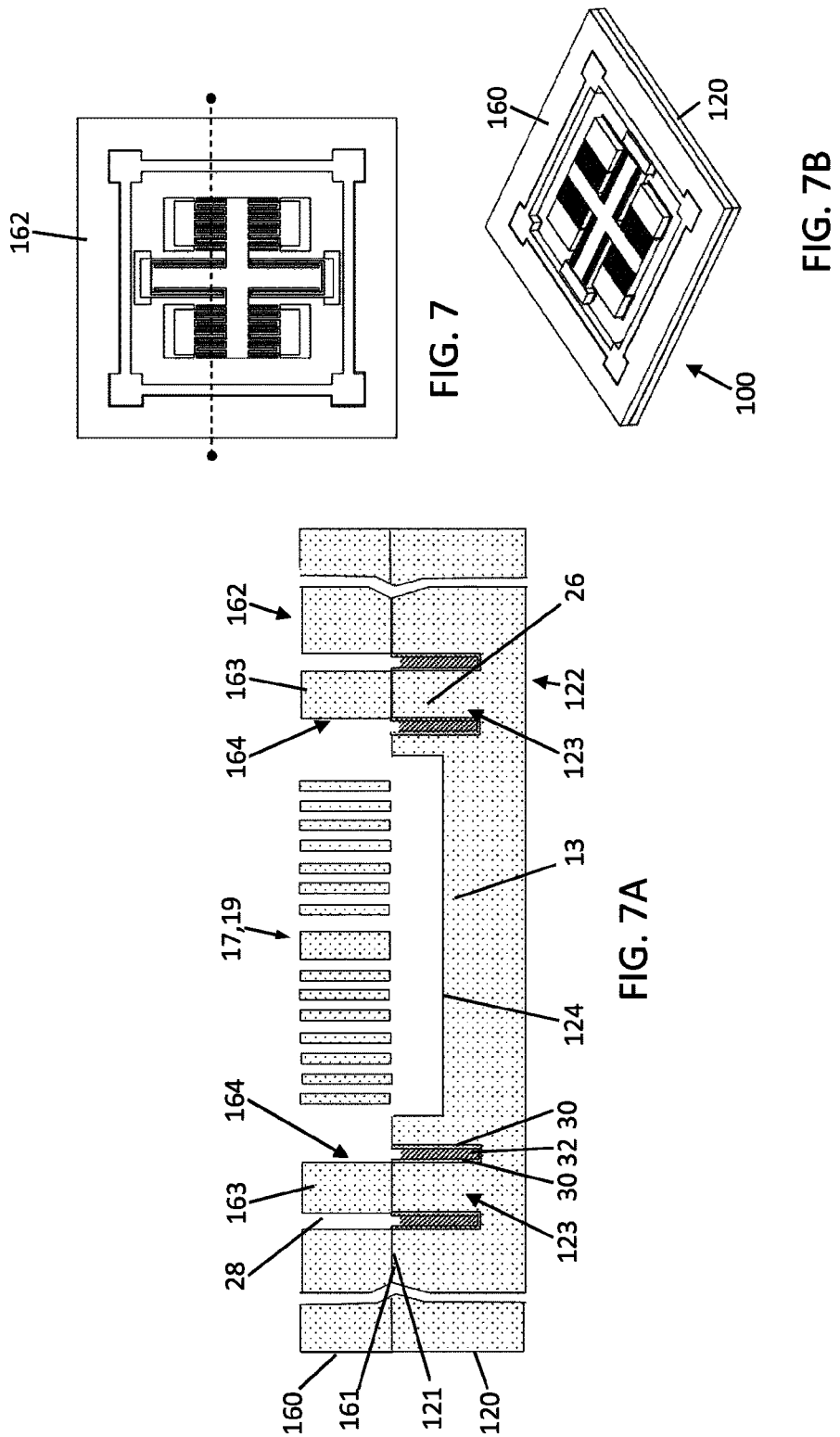

MEMS COMPONENTS AND METHOD OF WAFER-LEVEL MANUFACTURING THEREOF

RELATED PATENT APPLICATIONS

This patent application is a 35 U.S.C. § 371 national stage filing of International Application No. PCT/CA2014/050902, filed on Sep. 19, 2014, which claims priority to U.S. Provisional Patent Application Ser. No. 61/881,592, filed on Sep. 24, 2013. This application is also a continuation-in-part of U.S. application Ser. No. 14/622,619, filed Feb. 13, 2015, which is a continuation-in-part of International Application No. PCT/CA2014/050635, filed Jul. 4, 2014, which claims the benefit of U.S. Provisional Application 61/843,598, filed Jul. 8, 2013. The entire contents of each of these applications is expressly incorporated herein by reference.

TECHNICAL FIELD

The general technical field relates to micro-electro-mechanical systems (MEMS) and to methods for manufacturing MEMS, and more particularly to a method of integrating and packaging a MEMS device with an integrated circuit (IC) at the wafer level.

BACKGROUND

MicroElectroMechanical Systems, referred to as MEMS, are an enabling technology. Generally speaking, MEMS devices are integrated circuits containing tiny mechanical, optical, magnetic, electrical, chemical, biological, or other, transducers or actuators. They are manufactured using high-volume silicon wafer fabrication techniques developed over the last 50 years for the microelectronics industry. Their resulting small size and low cost make them attractive for use in an increasing number of applications in consumer, automotive, medical, aerospace/defense, green energy, industrial, and other markets.

In general, a MEMS device must interact with a particular aspect of its environment while being protected from damage from the surroundings. For example, a micro mirror has to interact with light and with an electrical addressing signal while being protected from moisture and mechanical damage. An accelerometer has to be free to move in response to accelerated motion, but be protected from dirt and moisture, and perhaps also be kept under vacuum or low pressure to minimize air damping. In almost every application an electrical connection must be made between the MEMS transducer or actuator and an external Integrated Circuit, also referred to as IC, IC chip or microchip, in order to read the transducer signal or to address the actuator.

In an effort to drive down final device costs, there has been a push to eliminate much of the packaging and wire bonding by moving to wafer-scale packaging processes in which the MEMS and IC wafers are combined at the wafer level. There are basically two approaches to wafer-level integration of MEMS and IC. In one approach, the wafer containing the MEMS sensor element is bonded directly to a substrate wafer and covered with a non-functional lid wafer, such as described in U.S. Pat. No. 8,069,726 or U.S. Pat. No. 8,486,744. This approach requires modifying the IC wafer to accommodate the MEMS layout, leading to inefficiencies in the IC layout. Additionally, in order to electrically access the IC input/output signals (IC I/O), which are trapped between the MEMS device and the IC, it is necessary to mechanically trim the MEMS chips and caps after wafer-scale bonding to expose the bond pads. Wire bonding and packaging are still required, and therefore this approach is not truly wafer-level packaging.

Through-Silicon Vias (TSVs) have been proposed as a means of electrically connecting the MEMS and IC, either in the MEMS cap, as in U.S. Pat. No. 8,084,332 or in the IC, as in U.S. Pat. No. 8,486,744. The use of TSVs requires that the silicon being penetrated be limited in thickness to 100-200 microns. Using TSVs restricts devices to small vertical dimensions, placing limits on design and performance.

In the second approach to MEMS/IC wafer-level integration, the MEMS wafer fabrication is completed and the MEMS wafer is hermetically sealed separately from the IC wafer. This permits more flexibility in the design, fabrication, and bonding of both the MEMS and IC. Conducting TSVs or regions of silicon defined by insulating TSVs are used to provide electrical paths through one of the caps, and the MEMS and IC can be solder bonded together at the wafer level without using bond wires.

However, this still leaves the IC electrical connections trapped between the MEMS and the IC.

In order to bring the signals from the MEMS/IC interface to the outside, it has been proposed that TSVs be put in the IC wafer, prior to wafer-level bonding to the MEMS wafer. The backside of the IC wafer is then thinned and metalized. In this way the electrical signals can be routed between the MEMS and IC where necessary and out the back for IC I/O. This approach enables true wafer-scale MEMS/IC integration and packaging since the bonded wafers can be diced directly into chips that can be solder-bonded to a PC board without any additional wire bonding or packaging.

However, in order to put TSVs in an IC wafer, the IC design and process flow must be drastically modified to accommodate them. The TSV process involves etching holes or trenches into the IC wafer, coating the trench surface with an insulator, and filling the trench with a conductor such as polysilicon or metal. The TSVs are large (5-30 microns wide and up to 100-200 microns deep) compared to typically sub-micron IC feature sizes. Consequently large areas of the IC area must be reserved for the TSVs, resulting in less area-efficient and cost-efficient IC designs. Additionally, the TSV and IC processes are incompatible. IC transistors are fabricated in the top few microns of the wafer, while the TSV must penetrate through or nearly through the IC wafer. The additional TSV processes require additional non-IC fabrication tools such Deep Silicon Reactive Ion Etchers (DRIE) and electroplating. If the TSV fill is polysilicon, the TSVs must be placed in the IC wafer at the beginning of the IC process to avoid thermally affecting the IC implants during polysilicon deposition. If the TSVs are added at the end of the IC process, they must be filled with metal, such as electroplated Cu. Finally, an additional grind and polish step must be added to thin the IC wafer in order to make electrical contact to the TSVs. All these considerations add cost, either through additional process steps, inefficient use of IC silicon active area, or a limited choice of IC fabrication plants capable of performing the TSV steps. What is needed then is a low cost wafer-scale MEMS/IC integration and packaging method that provides a hermetic MEMS/IC component requiring no additional bond wires or external packaging for attachment to a board, and that is applicable to a wide variety of MEMS devices.

SUMMARY

In accordance with an aspect of the invention, there is provided a method of manufacturing MEMS components.

In some embodiments, the method includes the steps of providing a MEMS wafer stack having an inner side and an outer side, the MEMS wafer stack comprising a top cap wafer and a MEMS wafer, the top cap wafer having opposed inner and outer sides and insulated conducting channels extending through the top cap wafer between the inner and outer sides. The MEMS wafer has opposed first and second sides and insulated conducting channels extending through the MEMS wafer between the first and second sides. The MEMS wafer also includes MEMS structures patterned therein, the top cap wafer and the MEMS wafer providing respective top and side walls for defining at least part of hermetically sealed chambers housing the corresponding MEMS structures. The inner side of the top cap wafer faces the first side of the MEMS wafer and the insulated conducting channels of the top cap wafer and of the MEMS wafer are aligned to form insulated conducting pathways. The method also includes a step of providing an integrated circuit wafer having an inner side with electrical contacts, and bonding the inner side of the MEMS wafer stack to the inner side of the integrated circuit wafer such that the insulated conducting pathways extend from the electrical contacts of the integrated circuit wafer, through the MEMS wafer, through the top cap wafer, to the outer side of the MEMS wafer stack. The method also includes a step of forming electrical contacts on the outer side of the top cap wafer, the electrical contacts being respectively connected to the insulated conducting channels of the top cap wafer. Finally, the method includes a step of dicing the MEMS wafer stack and the integrated circuit wafer into MEMS components such that the MEMS components respectively comprise the hermetically sealed chambers and MEMS structures.

In some embodiments, step a) includes the sub-steps of:
i) patterning the insulated conducting channels on the inner side of the top cap wafer such that the insulated conducting channels extend from the inner side and partially through the top cap wafer;
ii) bonding the first side of the MEMS wafer to the inner side of the top cap wafer; and
iii) patterning the insulated conducting channels, the MEMS structures and the sidewalls of the sealed chambers on the second side of the MEMS wafer and through the MEMS wafer.

In some embodiments, the method includes removing a portion of the outer side of the top cap wafer so as to isolate the insulated conducting channels, said step being performed after step iii) or after step b).

In some embodiments of the method, in step a), the wafer stack further includes a bottom cap wafer having opposed inner and outer side and insulated conducting channels extending through the bottom cap wafer between the inner and outer sides. The inner side of the bottom cap wafer faces the second side of the MEMS wafer. The insulated conducting channels of the bottom cap wafer are respectively aligned with the insulated conducting channels of the MEMS wafer and form part of the insulated conducting pathways. Step b) comprises bonding the outer side of the bottom cap wafer to the inner side of the integrated circuit wafer, the outer side of bottom cap wafer corresponding to the outer side of wafer stack.

In some embodiments, step a) comprises the sub-steps of:
i) patterning the insulated conducting channels of the top cap wafer on the inner side thereof such that the insulated conducting channels extend from the inner side of the top cap wafer and partially through the top cap wafer. Patterning the insulated conducting channels of the bottom cap wafer on the inner side thereof such that the insulated conducting channels extend from the inner side of the bottom cap wafer and partially through the bottom cap wafer;
ii) bonding the first side of the MEMS wafer to the inner side of the top cap wafer;
iii) patterning the insulated conducting channels, the MEMS structures and the sidewalls of the sealed chambers on the second side of the MEMS wafer and through the MEMS wafer; and
iv) bonding the second side of the MEMS wafer to the inner side of the bottom cap wafer.

Preferably, the step of patterning consists in etched trenches.

In some embodiments, the method comprises a step of removing a portion of the outer side of the bottom and top cap wafers so as to isolate their respective insulated conducting channels, this step being performed after step iv).

In some embodiments, step c) includes forming electrical contacts (43), such as bond pads, on the outer side of the bottom cap wafer, the electrical contacts of the bottom cap wafer being respectively connected to the insulated conducting pathways.

In some embodiments, step b) is performed by solder-bonding the electrical contacts of the bottom cap wafer to electrical contacts of the integrated circuit wafer.

In some embodiments, the method comprises a step of bonding one of the MEMS components obtained in step d) to a printed circuit board (PCB).

In some embodiments, in step a), the insulated conducting channels of the top cap wafer, the bottom cap wafer and/or of the MEMS wafer are fabricated using a trench fill process.

In some embodiments of the method, the top and bottom cap wafers are made of a silicon-based material, and in step a), the insulated conducting channels of the top cap wafer and of the MEMS wafer are fabricated by etching trenches around a conductive plug of the silicon-based material, and by filling the trenches of the top cap wafer with an insulating material.

In yet other embodiments, the insulated conducting channels of at least one of the top cap wafer and the MEMS wafer is fabricated by etching channels into the corresponding top cap wafer or the MEMS wafer, lining the channels with an insulating material and filling the channels with a conductive material.

In accordance with another aspect of the invention, a MEMS (microelectromechanical system) component is provided. The component comprises a top cap wafer having opposed inner and outer sides and insulated conducting channels extending between the inner side and the outer side through an entire thickness of the top cap wafer, the outer side being provided with electrical contacts connected to the insulated conducting channels. The component also includes a MEMS wafer having opposed first and second sides and insulated conducting channels extending between the first and second sides through an entire thickness of the MEMS wafer, the MEMS wafer including a MEMS structure patterned therein. The inner side of the top cap wafer and the first side of the MEMS wafer is bonded with their respective insulated conducting channels aligned to form insulated conducting pathways. The component also includes an integrated circuit wafer having opposed inner and outer sides, the inner side of the integrated circuit wafer including electrical contacts, such as bond pads. The inner side of the integrated circuit wafer faces the second side of the MEMS wafer so that electrical contacts of the integrated circuit wafer are electrically connected to the electrical contacts of the top cap wafer via the insulated conducting pathways, the top cap wafer and the MEMS wafer providing respective top and side walls defining at least part of a hermetically sealed chamber for housing the MEMS structure.

In some embodiments, the top cap wafer and the MEMS wafer are silicon-based and the integrated circuit wafer is a CMOS wafer.

In some embodiments, conducting portions of the respective insulated conducting channels of the top and/or bottom cap wafer are delimited by filled trenches.

In some embodiments, the insulated conducting channels of the top cap wafer and of the MEMS wafer comprise a conductive plug of silicon-based material surrounded by insulating material and/or by an air gap.

In some embodiments, the insulated conducting channels of the top cap wafer and/or of the MEMS wafer comprise etched channels lined with an insulating material and filled with a conductive material.

In some embodiments, the MEMS component includes a bottom cap wafer having opposed inner and outer sides and insulated conducting channels extending through the bottom cap wafer between the inner and outer sides. The inner side of the bottom cap wafer are bonded to the second side of the MEMS wafer. The insulated conducting channels of the bottom cap wafer are respectively aligned with the insulated conducting channels of the MEMS wafer and form part of the insulated conducting pathways. The outer side of the bottom cap wafer is bonded to the integrated circuit wafer. The insulated conducting pathways extend from the electrical contacts of the integrated circuit wafer and successively through the bottom cap wafer, the MEMS wafer and the top cap wafer to the electrical contacts of the top cap wafer.

In some embodiments, the MEMS component comprises at least one of an inertial sensor, an accelerometer, a gyroscope and a pressure sensor.

In some embodiments, at least one of the top and bottom cap wafers includes additional electrical contacts on its outer side. These additional electrical contacts are electrically connected to integrated circuits of the integrated circuit wafer. The top and/or bottom cap wafers also include electrodes operatively coupled to the MEMS structure, some of which are connected to the additional electric contacts of the IC wafer.

Other features and advantages of the embodiments of the present invention will be better understood upon reading of preferred embodiments thereof with reference to the appended drawings.

BRIEF DESCRIPTION OF THE DRAWINGS

FIG. 1A is a schematic exploded perspective view of a MEMS component, in accordance with an exemplary embodiment. FIG. 1B is a schematic cross-sectional view of the MEMS component of FIG. 1A. FIG. 1C is an enlarged view of a portion of FIG. 1B. FIG. 1D shows another possible variant of an insulated conducting channel in the top cap wafer.

FIG. 2A is a schematic exploded perspective view of a MEMS component, in accordance with another exemplary embodiment. FIG. 2B is a schematic cross-sectional view of the MEMS component of FIG. 2A.

FIG. 3A shows the MEMS component for a sealed MEMS device, formed from a three layer wafer stack and bonded to an IC wafer, according to an exemplary embodiment. FIG. 3B (PRIOR ART) shows a conventional sealed MEMS device bonded to an IC.

FIG. 4A shows a MEMS component with a MEMS device wafer bonded directly to an IC wafer, without a bottom cap wafer, according to a possible embodiment of the invention. FIG. 4B (PRIOR ART) shows an existing MEMS bonded directly to an IC wafer.

FIG. 5 is a schematic partial top view of a top cap wafer, according to a possible embodiment. FIG. 5A is a schematic partial cross-sectional view of the top cap wafer of FIG. 5, showing the patterning of trenches for forming insulated conducting channels. FIGS. 5B and 5C show steps for lining and filling of the patterned trenches, according to a possible embodiment. FIG. 5D shows a possible variant of an insulated conducting channel in the top cap wafer. FIG. 5E is an enlarged view of FIG. 5C.

FIG. 6A is a schematic partial cross-sectional view of a bottom cap wafer, according to a possible embodiment.

FIG. 7 is a partial top view of a MEMS wafer bonded to a top cap wafer, according to a possible embodiment. FIG. 7A is a schematic partial cross-sectional view of the MEMS wafer bonded to the top cap wafer. FIG. 7B is schematic perspective view of portions of a MEMS wafer and of a top cap wafer.

FIG. 10 also shows the deposition of an insulating cap layer.

Figure 8B:
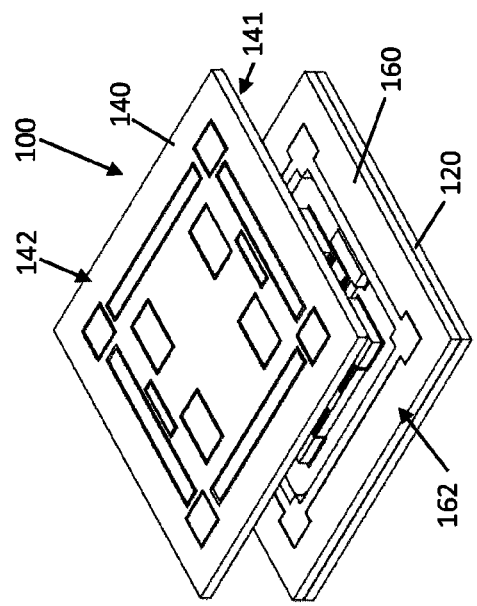
FIG. 8B is a schematic exploded perspective view of a section of a bottom cap wafer, and of a section of the MEMS wafer bonded to the top cap wafer.

It should be noted that the appended drawings illustrate only exemplary embodiments of the invention, and are therefore not to be construed as limiting of its scope, for the invention may admit to other equally effective embodiments.

DETAILED DESCRIPTION

In the following description, similar features in the drawings have been given similar reference numerals, and, in order to not unduly encumber the figures, some elements may not be indicated on some figures if they were already identified in preceding figures. It should also be understood that the elements of the drawings are not necessarily depicted to scale, since emphasis is placed upon clearly illustrating the elements and structures of the present embodiments.

The present description generally relates to a Micro-Electro-Mechanical System component, or MEMS component, including a MEMS device packaged with an IC chip. The description also relates to the wafer level bonding of a MEMS wafer stack to an integrated circuit wafer, also referred to as an IC wafer, and the dicing of the wafer stack and IC wafer to form several MEMS components. Each MEMS component obtained by this method includes one or several MEMS structures, hermetically sealed within the component. Each MEMS component also includes insulated conducting pathways extending vertically though its thickness, such that electrical signals from the IC chip can be routed through the MEMS device and accessed via electrical contacts on the top or outer face of the MEMS device. Advantageously, the use of TSVs within the IC wafer can be avoided, as well as wire-bonding.

Throughout the description, the term MEMS encompasses devices such as, but not limited to, accelerometer, gyroscope, pressure sensors, magnetometers, actuators, transducers, micro-fluidic, micro-optic devices and the likes. The MEMS wafer may also include microelectronic circuits such as power amplifiers, detection circuitry, GPS, microprocessors, and the likes.

It will be understood that throughout the present description, and unless stated otherwise, positional descriptors such as "top" and "bottom" should be taken in the context of the figures and should not be considered as being limitative. In particular, the terms "top" and "bottom" are used to facilitate reading of the description, and those skilled in the art of MEMS will readily recognize that, when in use, MEMS devices can be placed in different orientations such that the "top" and "bottom" cap wafers and the "top" and "bottom" sides of the wafers may be positioned upside down in certain configurations. In the following description, the convention is taken that "top" refers to the direction opposite the IC wafer.

According to an aspect of the invention, the MEMS components are provided with an architecture that enables the routing of electrical signals via insulated conducting pathways (such as feedthroughs and electrical leads) in the MEMS device. The MEMS device comprises at least a MEMS wafer and a top cap wafer. The MEMS wafer is typically the wafer or stack of wafers which includes a sensing and/or moving structure. The MEMS device can also optionally comprise a bottom cap wafer. An IC chip is bonded to the MEMS device and provides an electrical interface between the singulated MEMS and IC wafers which requires no bond wires. Furthermore, the MEMS device can act as an interposer to route I/O signals from the IC chip back through the MEMS device to electrical contacts (typically bond pads) on the MEMS cap (e.g., the top cap) which is opposite to the IC chip. The need for additional processing of the IC wafer for wafer thinning and addition of IC TSVs is thereby eliminated. While the IC wafer is typically a complementary metal-oxide-semiconductor (CMOS) wafer, other types of integrated circuits can also be considered, such as Bipolar-CMOS (BiCMOS), Silicon Carbide ICs, and Gallium-Arsenide ICs.

Different embodiments are possible. For example, the MEMS portion of the component can include a MEMS wafer and a first or top cap wafer, such as shown in FIGS. 1A, 1B and 4A. Alternatively, the MEMS portion of the component can further comprise a second or bottom cap wafer, as in FIGS. 2A, 2B and 3A. When manufacturing the MEMS components, the IC wafer can be bonded to the MEMS wafer directly, or to the second or bottom cap wafer. In the disclosed MEMS packaging architecture, the MEMS portion of the component includes electrically isolated "Three Dimensional Through-Chip Vias" (3DTCVs) to route signals from/to the top cap wafer, through the MEMS wafer and optionally through the bottom cap wafer to electrical contacts located on the bottom side of the MEMS device, at the interface with the IC chip. The bonded MEMS and IC wafers are diced (or singulated) into MEMS components (or chips) and the top cap can be flip-chip bonded to a PC board.

Examples of Possible Embodiments of MEMS Components

Referring to FIGS. 1A and 1B, there are shown a schematic perspective view and a schematic cross-sectional view, respectively, of a MEMS component 8, according to a possible embodiment. In this embodiment, the MEMS component 8 includes a top cap wafer 12, a MEMS wafer 16 and an IC wafer 44. The top cap wafer 12 has opposed inner and outer sides 121, 122 and insulated conducting channels 123 extending between the inner side 121 and the outer side 122 through an entire thickness of the top cap wafer 12. The outer side 122 is provided with electrical contacts 42, such as bond pads, which are connected to the insulated conducting channels 123, respectively. The top cap wafer 12 is typically an electrically conductive silicon-based wafer, although other types of wafers can be considered. Insulated conducting channels are electrically conducting segments extending within a layer of the MEMS device 10 (or MEMS portion of the component 8). The insulated conducting channels are electrically isolated from other components or features of the layer. Insulated conducting channels can have different configurations, as will be explained in greater detail below.

The MEMS wafer 16 has opposed first and second sides 161, 162 and insulated conducting channels 163 extending between the first and second sides 161, 162, through the entire thickness of the MEMS wafer 16. The MEMS wafer 16 can consist of a standard electrically conductive silicon-based wafer or of multiple silicon-based wafers bonded together.

The MEMS wafer 16 includes a MEMS structure 17 patterned therein. The MEMS structure 17 can include or be embodied by any sensing element or combination of sensing elements such as, but not limited to, membranes, diaphragms, proof masses, comb sensors, actuators, transducers, micro-valves, micro-pumps, and the like.

The inner side 121 of the top cap wafer 12 and the first side 161 of the MEMS wafer are bonded with their respective insulated conducting channels 123, 163 aligned to form insulated conducting pathways 33. Insulated conducting pathways, which can also be referred to as Three-Dimensional Through-Chip Vias (3DTCVs), are electrically conducting pathways surrounded by insulating material and extend through the entire thickness of the MEMS device 10, in this case formed by the top cap wafer 12 and the MEMS wafer 16.

The insulated conducting channels 123, 163 can include a conductive plug 26 (or conductive pad) of a silicon-based material, in this case corresponding to a portion of the wafers. As best shown in enlarged FIG. 1C, the insulated channels 123 in the top cap wafer comprises a silicon wafer plug 26 surrounded by a trench. The trench is lined by an insulating material 30, preferably a dielectric such as silicon dioxide, and the trench is filled with a conductive material 32, such as metal, silicon or polysilicon. In the MEMS wafer, the conductive plug 26 can simply be surrounded by an air gap. Alternatively, the insulated conducting channels 123 and/or 163 can be formed as etched channels, or holes, filled with an insulating material 30, such as shown in FIG. 1D.

Referring back to FIGS. 1A and 1B, the IC wafer 44 has opposed inner and outer sides 441, 442. The IC wafer 44 includes several electronic circuits 62 which can be operatively connected to the MEMS structure 17 and/or electrodes 13 of the MEMS wafer stack 10. The IC wafer 44 is typically a CMOS wafer, although other types of ICs can be used. The inner side 441 of the IC wafer 44 includes electrical contacts 48, such as bond pads. The inner side 441 of the IC wafer 44 faces the second side 162 of the MEMS wafer 16. In the present case, the inner side 441 of the integrated circuit wafer faces directly the second side 162 of the MEMS wafer 16, but other arrangements are possible, as discussed below.

The electrical contacts 48 of the integrated circuit wafer 44 are electrically connected to the electrical contacts 42 of the top cap wafer 12 via the insulated conducting pathways 33. In this embodiment, electrical contacts 43 are also provided on the outer side 162 of the MEMS wafer, and the contacts 43 from the MEMS wafer 14 and the contacts 48 (such as bond pads) from the IC wafer 44 can be solder-bonded, or bump-bonded, with solder bumps. The top cap wafer 12 and the MEMS wafer 16 provide respective top and side walls 124, 164 which define, at least partially, the hermetically sealed chamber 31 for housing the MEMS structure 17, such as comb sensors for example. In this embodiment, the bottom sidewall is formed by the IC wafer 44, but other arrangements are possible, an example of which is provided in FIGS. 2A and 2B. Insulating and/or metallization layers 40, 41 are typically applied and patterned on the outer sides of the MEMS device 10.

Additional structures and/or features can be provided in the top cap wafer 12 and/or MEMS wafer 16, such as electrodes 13 and leads. The MEMS device 10 can advantageously act as an interposer, with the insulated conducting pathways 33 used as vertical feedthroughs extending from the IC wafer 44 up to electrical contacts 42 on the top/outer side 122 of the MEMS device 10. Integrated circuits 62 of the IC wafer 44 can thus be accessed from the top side of the MEMS component 8. The micro-circuits 62 can also be electrically coupled to the various electrodes and MEMS structures 17, to read and/or transmit signals from/to the electrodes 13 and/or other structures. Additional electrical contacts on the outer sides of the MEMS wafer stack 10 can be provided, with additional insulated conducting pathways being operatively connected to these additional contacts and to the electrodes and/or structures and/or micro-circuits 62.

Referring to FIGS. 2A and 2B, there are shown a schematic perspective view and a schematic cross-sectional view, respectively, of a MEMS component 80, according to another possible embodiment.

The MEMS component 80 includes a top cap wafer 12, a MEMS wafer 16 and an integrated circuit wafer 44, similar to those described in reference to FIGS. 1A and 1B. However in this case, the component 80 also comprises a bottom cap wafer 14. The bottom cap wafer 14 is typically an electrically conducting silicon-based wafer, although other types of wafer can be considered. The bottom cap wafer 14 has opposed inner and outer sides 141, 142 and insulated conducting channels 143 extending through the bottom cap wafer 14, between its inner and outer sides 141, 142. The inner side 141 of the bottom cap wafer 14 is bonded to the second side 162 of the MEMS wafer 16, with the insulated conducting channels 143 of the bottom cap wafer 14 respectively aligned with the insulated conducting channels 163 of the MEMS wafer 16. The insulated conducting channels 143 thus form part of the insulated conducting pathways 33. The outer side 142 of the bottom cap wafer 14 is bonded to the integrated circuit wafer 44. Accordingly, the insulated conducting pathways 33 extend from the electrical contacts 48 of the integrated circuit wafer 44 and successively through the bottom cap wafer 14, the MEMS wafer 16 and the top cap wafer 12 to the electrical contacts 42 of the top cap wafer 12. As in the embodiment of FIGS. 1A and 1B, the inner side 441 of the integrated circuit wafer 44 faces the second side 162 of the MEMS wafer 16, but this time indirectly since a bottom cap wafer 124 is provided between the MEMS wafer 16 and the integrated circuit wafer 44.

Similarly to the embodiment of FIGS. 1A and 1B, the MEMS component 80 of FIGS. 2A and 2B can include any type of MEMS, such as for example an inertial sensor, an accelerometer, a gyroscope and a pressure sensor. The MEMS component 80 also preferably has at least one of the top and bottom cap wafers 12, 14 comprising additional electrical contacts 47 on its outer side. These additional electrical contacts 47 are connected to integrated circuits 62 of the integrated circuit wafer 44 at one end, and to electrodes 13 or 15 and/or the MEMS structure 17 of the MEMS device 10 at an opposed end. Electrical signals can thus be routed from/to integrated circuit wafer 44 to MEMS features (leads, feedthroughs, electrodes, sensing elements) of the MEMS device 10 via additional insulated conducting pathways. An underfill 66 can be added between the bottom cap wafer 14 and the IC wafer 44.

It will noted here that although the terms "top cap wafer", "MEMS wafer", "bottom cap wafer" and "IC wafer" are used for describing the different layers of the MEMS components 8, 80, these terms refers to the diced portion or section of larger wafers. During the manufacturing, as will described in more detail with reference to FIGS. 5A to 13, entire top 120, MEMS 160, bottom 140 and IC 440 wafers are patterned, processed and bonded, and the MEMS components 8, 80 are obtained after dicing the bonded wafers into singulated or individual components.

Referring now to FIGS. 3A and 3B, and 4A and 4B, schematic cross-sectional views of different MEMS architectures are shown. FIGS. 3A and 4A are possible embodiments of MEMS components according to the present invention, and for comparison, FIGS. 3B and 4B are schematic representation of existing MEMS designs and MEMS bonded directly to the IC wafer, respectively. In these prior art implementations, the cap 2 is an inert structure used to protect and seal the MEMS. Once the MEMS and IC wafers are bonded together, the IC inputs/outputs (I/O) 4 are trapped between the MEMS and the IC and are no longer electrically accessible. Other wafer-scale packaging approaches rely on the use of TSVs through the IC wafer to access signals. In such approaches, using TSVs involves redesigning the IC wafer to isolate areas for the large TSVs; then adding the TSVs post-ICs; and then thinning the IC wafer to provide access to the TSVs. These processes add cost and limit IC wafer source options. As can be appreciated, and as shown in FIGS. 3A and 4A, signals from the IC wafer 44 can be routed to the top/outer side of the MEMS components 8, 80, without requiring any wire-bonding or TSVs in the IC wafer. The components 8, 80 can be flip chip bonded directly to a Printed Circuit Board (PCB).

Method of Manufacturing MEMS Component

In accordance with another aspect, there is provided a method for manufacturing MEMS components using wafer-scale integration and packaging.

Broadly described, the method comprises the steps of providing a MEMS wafer stack including at least a top cap wafer and a MEMS wafer. The MEMS wafer stack is patterned with insulated conducting pathways. An IC wafer is also provided. The IC wafer is bonded to the MEMS wafer stack, the MEMS wafer stack and the IC wafer are then diced into individual MEMS components, with MEMS structure(s) being hermetically sealed in chambers formed either between the MEMS wafer stack and the IC wafer, or entirely within the MEMS wafer stack.

The method for manufacturing the MEMS components will be described with reference to FIGS. 5A to 14, which schematically illustrate steps and possible sub-steps of an exemplary embodiment of the method. It will be noted that the method described is a wafer level packaging method, and therefore entire wafers or large portions of wafers are used in the steps occurring before the dicing/singulating step. However, for clarity, in FIGS. 5A to 11, only the portion of the wafer corresponding to a single MEMS component is shown, although a plurality of such MEMS components are manufactured on each wafer. As such, one skilled in the art will understand that the portion of the wafer shown in FIGS. 5A to 11 is repeated on the area of the corresponding wafers. In other words, the different steps of the method (such as the patterning, lining, depositing, grinding, passivating, bonding and dicing) are performed on the entire surface of the wafers (or at least on a substantial section of the wafers), at the "wafer-scale", in order to fabricate a plurality of preferably identical MEMS components. For clarity, the perspective and top views show only portions of the wafers associated to one of the many MEMS components fabricated from entire wafers.

Referring to FIGS. 5A to 5E, at the start of the fabrication of the MEMS packaging architecture, a wafer 120, preferably an electrically conducting silicon-based wafer, is provided. The top cap wafer 120 is patterned with predetermined patterns by etching trenches 28 into the silicon 26 and filling the trenches 28 with either an insulating material 30, or an insulating layer 30 followed by a conductive fill 32, as shown in FIGS. 5D and 5E, respectively. Numerous trench fill processes are available at different MEMS fabrication facilities and the insulating and conducting materials vary between them. The details of the trench fill process are not critical. Preferably, trenches 28 are etched to form islands or plugs of silicon, which may eventually become electrodes and feedthroughs, are surrounded by insulating barriers. The trenches 28 are patterned into the silicon 26 at a sufficient depth, which is at least slightly greater than the final desired final cap thickness. The insulated conducting channels 123 to be formed are patterned on the inner side 121 of the top cap wafer 120 such that the insulated conducting channels 123 extend from the inner side 121 and partially through the top cap wafer 120. The top wall 124 of the chamber is also preferably patterned, and also preferably the electrodes 13.

For embodiments of the method in which a bottom cap wafer is used, the same steps as described above are performed on another silicon wafer 140, as shown in FIG. 6A. The bottom cap wafer 140 is patterned with trenches 28 to form insulated conducting channels 143, from the inner side 141 and partially through the bottom cap wafer 140. The bottom wall 144 of the chamber is also preferably patterned during this step, and also preferably electrodes 15.

Referring to FIGS. 7, 7A and 7B, a MEMS wafer 160 is provided. A first side 161 of the MEMS wafer 160 is bonded to the inner side 121 of the top cap wafer 120. The MEMS wafer 160 also typically consists of a silicon-based wafer, and can be a single wafer or multi-stack wafer. During this step, the MEMS wafer 160 is aligned and bonded to the top cap wafer 120, with the inner side 121 of the top cap wafer 120 facing the first side 161 of the MEMS wafer 160. The wafer bonding process used is typically one that provides a conductive bond, such as fusion bonding, gold thermocompression bonding, or gold-silicon eutectic bonding. Insulated conducting channels 163, MEMS structures 17, and the sidewalls 164 of the cavities which will form part of the sealed chambers are patterned on the second side 162 of the MEMS wafer 16 and through the MEMS wafer 16. The partial insulated conducting channels 123 of the top cap wafer 120 and the insulated conducting channels 163 of the MEMS wafer 16 are aligned to form the future insulated conducting pathways 33. The desired MEMS patterns can include electrodes, leads, and feedthroughs, delimited by trenches 28 in the MEMS wafer 160. The silicon plugs 26 on the MEMS wafer 160 are aligned to the corresponding plugs 26 on the top cap wafer 120 and electrodes 13 on the top cap wafer 120 are aligned to the relevant electrodes and structure 17, 19 of the MEMS wafer 160. If no bottom wafer is used, then the MEMS wafer stack 100 only includes the top cap wafer 120 and the MEMS wafer 160.

As explained previously, the insulated conducting channels 123 of the cap wafers 120, 140 and of the MEMS wafer 160 are preferably fabricated by etching trenches around conductive plugs 26 of the silicon-based wafer. For the top and/or bottom cap wafers 120, 140, the trenches are lined with an insulating material 30 and the lined trenches are filled with a conductive material 32. The insulated conducting channels of the MEMS wafer 160 can be fabricated the same way, or alternatively, the trenches 28 can be left unfilled; in this case the air surrounding the silicon plugs 26 acts as an insulator. Yet another alternative consists in filling the trenches with an insulating material 30. The channels 123, 143 or 163 can also be fabricated using a TSV process.

Figure 8A:
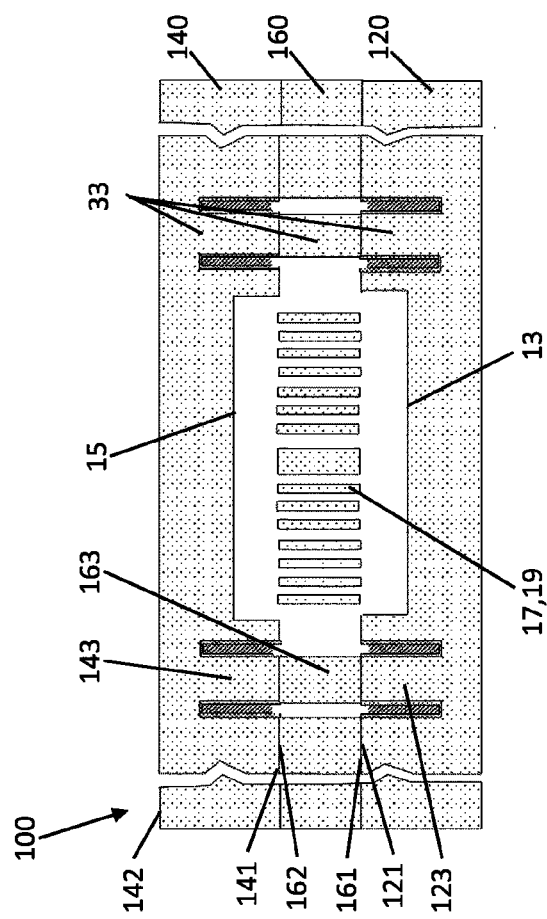
FIG. 8A is a schematic partial cross-sectional view of the bottom cap wafer bonded to the MEMS wafer, according to a possible embodiment.

Referring to FIGS. 8A and 8B, in embodiments of the method where a bottom cap wafer 140 is used as part of the MEMS wafer stack 100, the second side 162 of the MEMS wafer 16 is bonded to the inner side 141 of the bottom cap wafer 140. A wafer bonding method such as fusion bonding, gold thermocompression bonding, or gold-silicon eutectic bonding can be used to provide electrical contact between the conducting channels 163 of the MEMS wafer, and the conducting channels 143 of the bottom cap wafer 140. Conducting pathways 33, such as feedthroughs, thus extend from the bottom cap 140 to the top cap 120. Additional pathways can also be formed and connected to the MEMS structure 17 and/or electrodes 13, 15, 19 in the bottom, top and/or MEMS wafers 120, 140, 160. At this point, the MEMS structure 17 of each of the future MEMS components is hermetically sealed in a corresponding chamber 31 between the cap wafers 120, 140. The conducting channels 123, 163, 143 are aligned to form what will become insulated conducting pathways 33. Electrodes 13, 15, 19 of the top, MEMS and bottom wafers are also aligned. Since the conducting channels 123, 163, 143 do not fully penetrate the cap wafers 120, 140, the pathways 33 and the electrodes 13, 15 on each cap are shorted together through the remaining silicon.

Figure 9B:
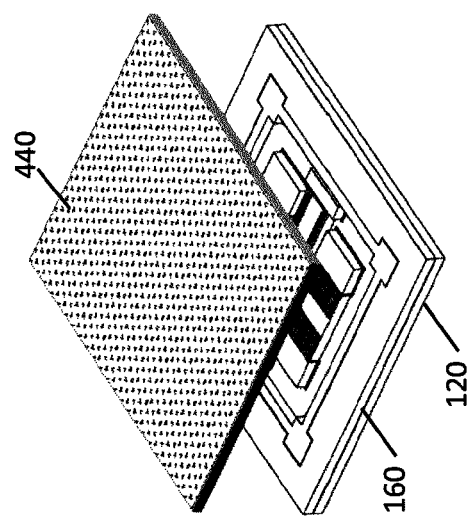
FIG. 9B is a schematic exploded perspective view of the sections of the IC wafer and of the MEMS wafer stack shown in FIG. 9A.
Figure 9A:
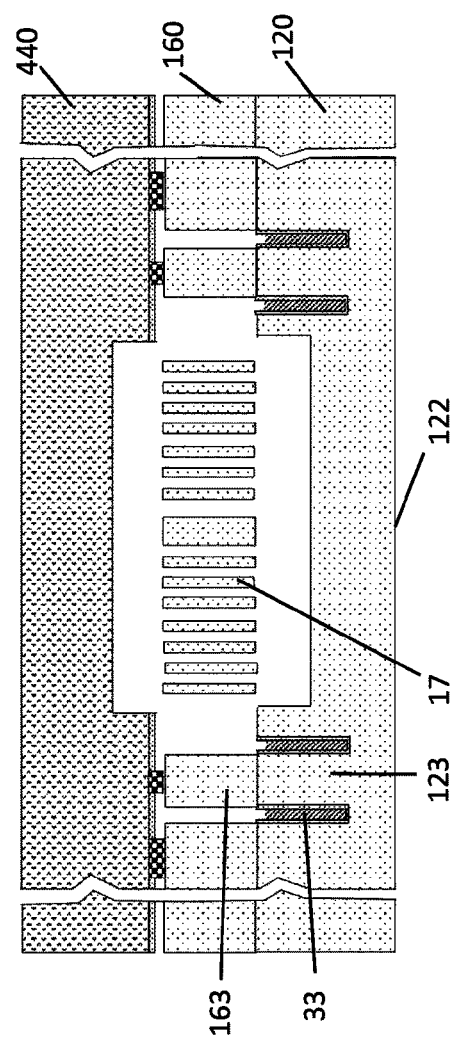
FIG. 9A is a schematic partial cross-sectional view of a MEMS wafer stack bonded to an IC wafer, wherein the MEMS wafer stack that does not include a bottom cap wafer.

Referring to FIGS. 9A and 9B, in an alternative embodiment, a bottom cap wafer is not used and the MEMS wafer stack 100, formed by the MEMS wafer 160 and top cap wafer 120, are bonded directly to a pre-patterned integrated wafer 440, preferably using a eutectic solder bond. The bonding of the MEMS wafer directly to the CMOS wafer is typically a metal bond, such as eutectic solder or compression bond. The bond metal has two functions: a general mechanical bond to provide a hermetic chamber and electrical contacts where required. Preferably, both the MEMS and IC wafers have pre-existing metal pads and the solder attaches them. In order to insulate the pathways and electrodes 33, 13 from one another, to form a component such as shown in FIG. 4A, a portion of the outer side 122 of the top cap wafer 12 then needs to be removed. The insulated conducting channels 123 are isolated after the top cap wafer 120 has been thinned, such as by grinding. The step of removing or thinning the outer side 122 of the top cap wafer 120 can be performed after the step of bonding of the integrated circuit wafer 440 to the MEMS wafer stack 100.

The possible sub-steps for forming electrical contacts on the outer side of the cap wafers will be explained with reference to FIGS. 10 and 11. Of course, for embodiments in which a single cap wafer is used, the process of forming electrical contacts only occurs on this cap, and electrical contacts are also formed on the side of the MEMS wafer facing the IC wafer.

Figure 10:
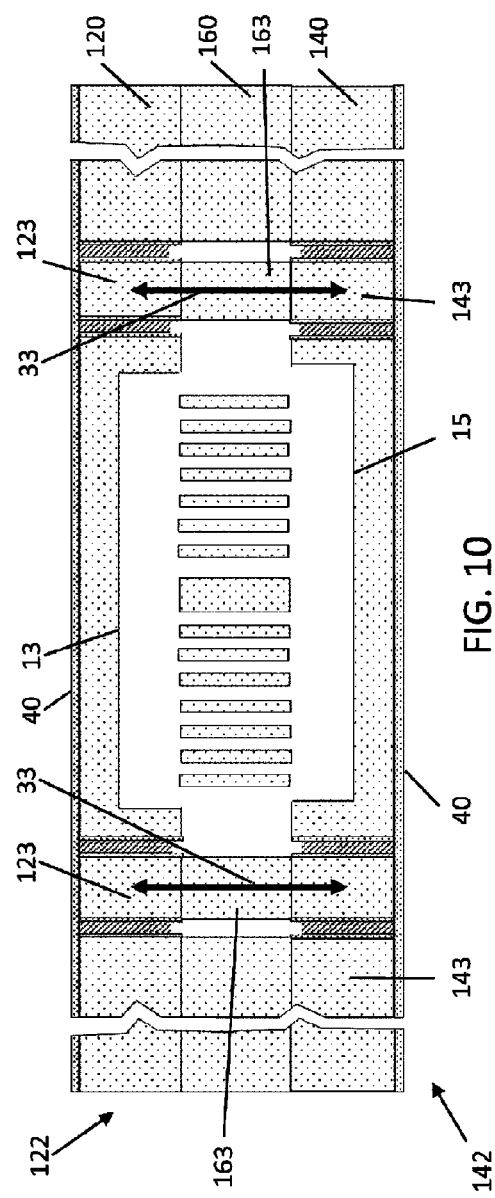
FIG. 10 is a partial cross-sectional view a MEMS wafer stack being completed, according to a possible embodiment, showing the thinning of the top and bottom cap wafers to isolate the insulated conducting channels.

Referring to FIG. 10, a portion of the outer side 122, 142 of the bottom and top cap wafers 120, 140 is removed so as to isolate their respective insulated conducting channels 123, 143. More specifically, both cap wafers 120, 140 are ground and polished to expose the insulating channels 123, 143, so as to form the insulated conducting pathways 33. The electrodes 13, 15 are also electrically isolated and connected to additional conducting pathways and/or electrical contacts 47, opening on the top and/or bottom cap wafers 120, 140. The outer surfaces 122, 142 can be passivated with an insulating oxide layer 40 to protect them.

Figure 11:
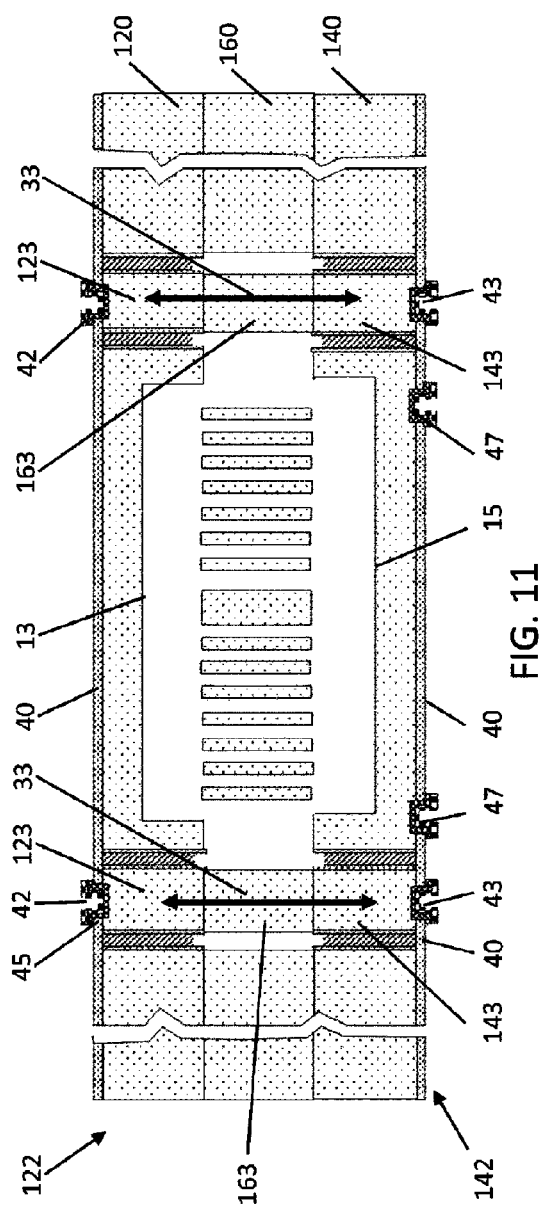
FIG. 11 is a partial cross-sectional view of the MEMS wafer stack of FIG. 10, showing the bond pad metallization on the top and bottom cap wafers, according to a possible embodiment.

Referring to FIG. 11, electrical contacts 42 on the outer side 122 of the top cap wafer 120 are formed. The electrical contacts 42 are respectively connected to the insulated conducting channels 123 of the top cap wafer 120. In this variant of the process, electrical contacts 43 on the outer side 142 of the bottom cap wafer 14 are also formed, the electrical contacts 43 being respectively connected to the insulated conducting channels 143, and thus to the pathways 33 as well. More specifically, the openings are made in the cap insulating layer 40, over or in-line with the insulated conducting pathways 33 extending from the top to the bottom cap wafers 120, 140. Then, bond pad metallization 45 is applied. Electrical contacts 43 from the bottom cap wafer 140 are electrically connected to the contacts 32 of the top cap wafer 120, and are thus accessible from the top, such as for wafer bonding. Additional contacts 47 can also be formed, and connected to the electrodes 13, 15 and/or the MEMS structure 17.

Figure 12:
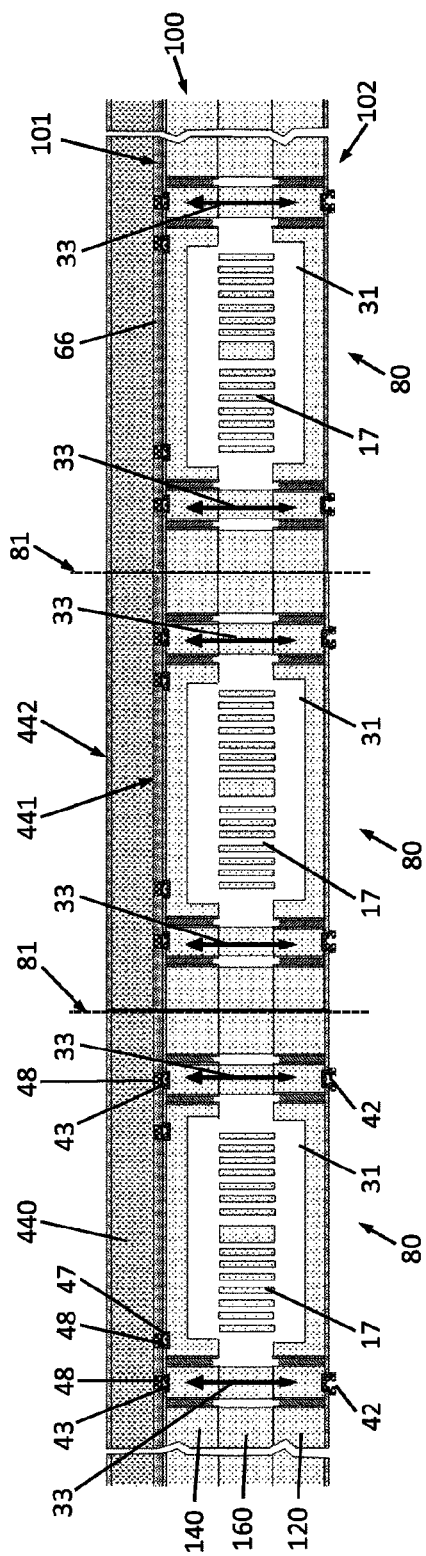
FIG. 12 is a schematic cross-sectional view of an IC wafer bonded to a MEMS wafer stack for forming several MEMS components, before wafer dicing, according to a possible embodiment.
Figure 13:
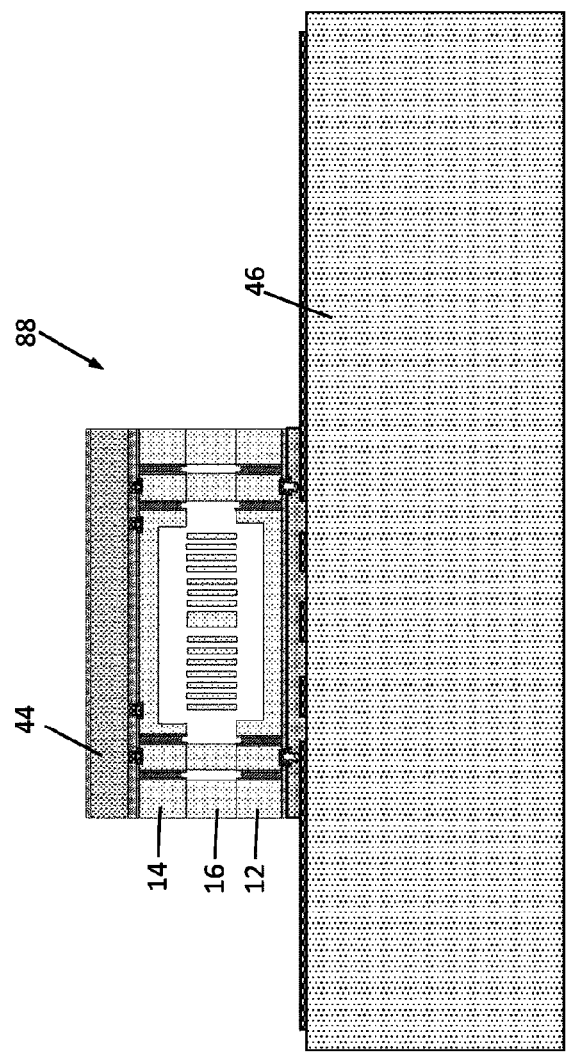
FIG. 13 is a schematic cross-sectional view of one of the MEMS components of FIG. 12, flip chip bonded via the electrical contacts of its top cap to a PC board, according to a possible embodiment.

Referring to FIG. 12, an IC wafer 440 having an inner side 441 with electrical contacts 48 is provided. The inner side 101 of the MEMS wafer stack 100 is bonded to the inner side 441 of the integrated circuit wafer 440 such that the insulated conducting pathways 33 extend from the electrical contacts 48 of the IC wafer 440, through the MEMS wafer 160, through the top cap wafer 120, to the outer side 102 of the MEMS wafer stack 100. This step can be made by solder-bonding the electrical contacts 43 of the bottom cap wafer 140 to electrical contacts 48 of the IC wafer 440. As can be appreciated, an entire IC wafer 440 is solder bonded to bottom cap wafer 140 of a wafer stack 100 at the wafer level. Preferably, a patterned polymeric underfill 66 is used, to protect the interface, as is known in the industry. The bonded stack formed by the MEMS stack 100 and the IC wafer 440 can then be diced into individual MEMS components or chips 80, along cutting lines 81. The MEMS components 88 need no additional packaging or wire bonding, and can be flip chip bonded directly to a PCB 46, as shown in FIG. 13.

Figure 14:
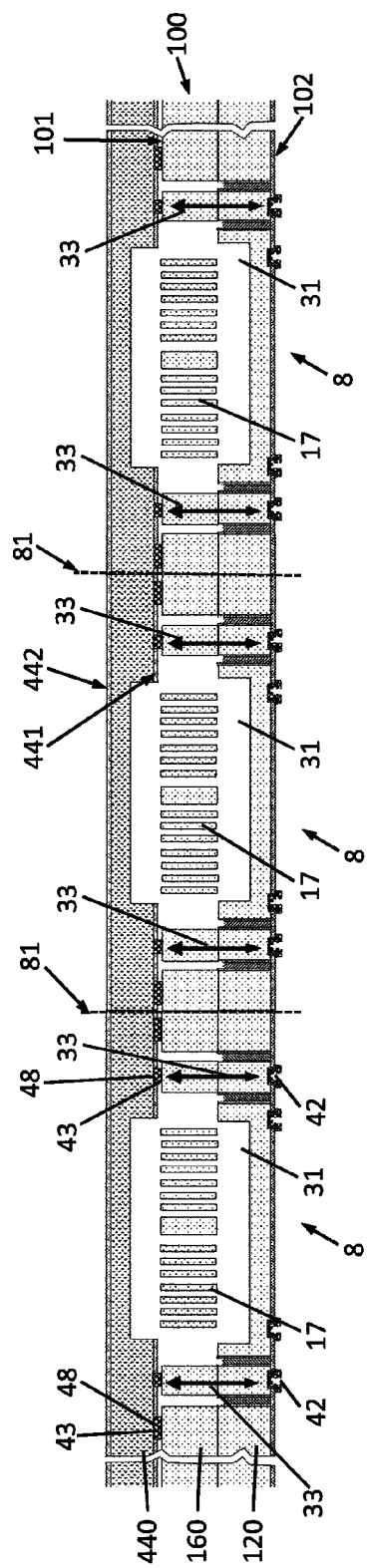
FIG. 14 is a schematic cross-sectional view of an IC wafer bonded to a MEMS wafer stack for forming several MEMS components, before wafer dicing, according to another possible embodiment.

Referring to FIG. 14, for MEMS components 8 for which no bottom cap wafer is used, the bonding and dicing process is similar, except that the MEMS wafer 160 is provided with electrical contacts 43, such as bond pads, which are solder-bonded to the contacts 48 of the IC wafer 440. The dicing or singulating step is also conducted along predetermined cut lines 81 such that each MEMS component 8 has a hermetically sealed cavity 31 with a MEMS structure 17 housed therein.

Of course, other processing steps may be performed prior, during or after the above described steps. Also, the order of the steps may also differ, and some of the steps may be combined or omitted. The figures illustrate only exemplary embodiments of the invention and are, therefore, not to be considered limiting of its scope, for the invention may admit to other equally effective embodiments. The scope of the claims should not be limited by the preferred embodiments set forth in the examples, but should be given the broadest interpretation consistent with the description as a whole.

The invention claimed is:

1. A microelectromechanical system (MEMS) component, comprising:
a top cap wafer having an inner side and an outer side and insulated conducting channels extending between the inner side and the outer side through a thickness of the top cap wafer, the outer side being provided with electrical contacts connected to the insulated conducting channels;
a MEMS wafer having a first side and a second side and insulated conducting channels extending between the first side and the second side through a thickness of the MEMS wafer, the MEMS wafer including a MEMS structure patterned therein, the inner side of the top cap wafer and the first side of the MEMS wafer being bonded such that the insulated conducting channels of the top cap wafer and the insulated conducting channels of the MEMS wafer are aligned to form insulated conducting pathways; and
an integrated circuit wafer having an inner side and an outer side, the inner side of the integrated circuit wafer including electrical contacts, the inner side of the integrated circuit wafer facing the second side of the MEMS wafer such that electrical contacts of the integrated circuit wafer are electrically connected to the electrical contacts of the top cap wafer with the insulated conducting pathways, the top cap wafer and the MEMS wafer providing a top cap wafer side wall and a MEMS wafer side wall defining at least a part of a hermetically sealed chamber that houses the MEMS structure.

2. The MEMS component according to claim 1, wherein the top cap wafer and the MEMS wafer comprise a silicon material and the integrated circuit wafer is a CMOS wafer.

3. The MEMS component according to claim 1, wherein a conducting portion of each insulated conducting channel of the top cap wafer includes a filled trench.

4. The MEMS component according to claim 1, wherein each insulated conducting channel of the top cap wafer comprises a conductive plug of a silicon material surrounded by an insulating material and each insulating conducting channel of the MEMS wafer comprises a conductive plug of a silicon material surrounded by an air gap.

5. The MEMS component according to claim 1, wherein each insulated conducting channel of the top cap wafer and/or of the MEMS wafer comprises an etched channel lined with an insulating material and filled with a conductive material.

6. The MEMS component according to claim 1, comprising a bottom cap wafer having an inner side and an outer side and insulated conducting channels extending through the bottom cap wafer between the inner side and the outer side, the inner side of the bottom cap wafer being bonded to the second side of the MEMS wafer, the insulated conducting channels of the bottom cap wafer being respectively aligned with the insulated conducting channels of the MEMS wafer and forming a part of the insulated conducting pathways, the outer side of the bottom cap wafer being bonded to the integrated circuit wafer, the insulated conducting pathways extending from the electrical contacts of the integrated circuit wafer and successively through the bottom cap wafer, the MEMS wafer and the top cap wafer to the electrical contacts of the top cap wafer.

7. The MEMS component according to claim 6, wherein at least one of the top cap wafer and the bottom cap wafer comprises:
　　additional electrical contacts on the outer side of said at least one of the top cap wafer and the bottom cap wafer, said additional electrical contacts being electrically connected to integrated circuits of the integrated circuit wafer; and
　　electrodes operatively coupled to the MEMS structure and to the additional electrical contacts, respectively.

8. The MEMS component according to claim 1, comprising at least one of an inertial sensor, an accelerometer, a gyroscope and a pressure sensor.

* * * * *